(12) United States Patent
Miyashita

(10) Patent No.: US 12,188,149 B2
(45) Date of Patent: Jan. 7, 2025

(54) METHOD OF MANUFACTURING SEMICONDUCTOR DEVICE

(71) Applicant: SUMITOMO ELECTRIC DEVICE INNOVATIONS, INC., Kanagawa (JP)

(72) Inventor: Kohei Miyashita, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 450 days.

(21) Appl. No.: 17/660,713

(22) Filed: Apr. 26, 2022

(65) Prior Publication Data

US 2022/0411960 A1  Dec. 29, 2022

(30) Foreign Application Priority Data

Jun. 23, 2021 (JP) ................. 2021-104167

(51) Int. Cl.

| H01L 21/02 | (2006.01) |
| C23C 16/46 | (2006.01) |
| C23C 16/52 | (2006.01) |
| C30B 25/10 | (2006.01) |
| C30B 25/16 | (2006.01) |
| H01L 21/66 | (2006.01) |

(52) U.S. Cl.
CPC ............ C30B 25/16 (2013.01); C23C 16/46 (2013.01); C23C 16/52 (2013.01); C30B 25/10 (2013.01); H01L 21/0254 (2013.01); H01L 21/0262 (2013.01); H01L 22/20 (2013.01)

(58) Field of Classification Search
CPC .......... C30B 25/16; C23C 16/46; C23C 16/52
See application file for complete search history.

(56) References Cited

U.S. PATENT DOCUMENTS

2005/0217799 A1* 10/2005 O'Meara ........... H01L 21/67109
156/345.52
2020/0071823 A1* 3/2020 Ma ........................ G01B 21/30

FOREIGN PATENT DOCUMENTS

| JP | 2004-095780 | 3/2004 |
| JP | 2012-156196 | 8/2012 |

* cited by examiner

Primary Examiner — Walter H Swanson
(74) Attorney, Agent, or Firm — IPUSA, PLLC

(57) ABSTRACT

A method of manufacturing a semiconductor device, includes attaching a first susceptor to a film forming apparatus, measuring a magnitude of a warp of the first susceptor, setting a first initial film formation condition as a film formation condition of the film forming apparatus in accordance with the measured magnitude of the warp of the first susceptor, and placing a plurality of first wafers on the first susceptor and forming a first film on the plurality of first wafers under the film formation condition. The setting of the first initial film formation condition includes reading the first initial film formation condition from a recording medium storing a database. The database includes a plurality of pieces of data in which magnitudes of warps of susceptors are associated with initial film formation conditions for forming the first film.

10 Claims, 19 Drawing Sheets

METHOD OF MANUFACTURING SEMICONDUCTOR DEVICE

CROSS-REFERENCE TO RELATED APPLICATIONS

This application claims priority to Japanese Patent Application No. 2021-104167 filed on Jun. 23, 2021, the entire contents of which are incorporated herein by reference.

BACKGROUND

1. Field of the Invention

The present disclosure relates to a method of manufacturing a semiconductor device.

2. Description of the Related Art

A semiconductor film such as a nitride semiconductor film is famed by placing a plurality of wafers on a susceptor mounted in a film formation chamber, for example (Patent Documents 1 and 2).

The susceptor may be warped. In addition, the susceptor is exposed to a corrosive gas at a high temperature during film formation and is consumed, so that the susceptor is frequently replaced. In a case where a direction or a magnitude of warp of the susceptor before and after replacement is different, a film thickness distribution of the film formed on the wafers also changes owing to the change in the direction or the magnitude of the warp of the susceptor, even though film formation conditions in the film formation chamber before and after replacement are the same. For this reason, conventionally, after replacement of the susceptor, a trial production of a film has been carried out in order to determine a mass-production film formation condition suitable for mass production.

RELATED ART DOCUMENTS

Patent Document

[Patent Document 1] Japanese Unexamined Patent Application Publication No. 2004-95780
[Patent Document 2] Japanese Unexamined Patent Application Publication No. 2012-156196

SUMMARY

A method of manufacturing a semiconductor device, includes attaching a first susceptor to a film forming apparatus, measuring a magnitude of a warp of the first susceptor, setting a first initial film formation condition as a film formation condition of the film forming apparatus in accordance with the measured magnitude of the warp of the first susceptor, and placing a plurality of first wafers on the first susceptor and forming a first film on the plurality of first wafers under the film formation condition. The setting of the first initial film formation condition includes reading the first initial film formation condition from a recording medium storing a database. The database includes a plurality of pieces of data in which magnitudes of warps of susceptors are associated with initial film formation conditions for forming the first film.

BRIEF DESCRIPTION OF THE DIAGRAMS

DETAILED DESCRIPTION

Figure 1:
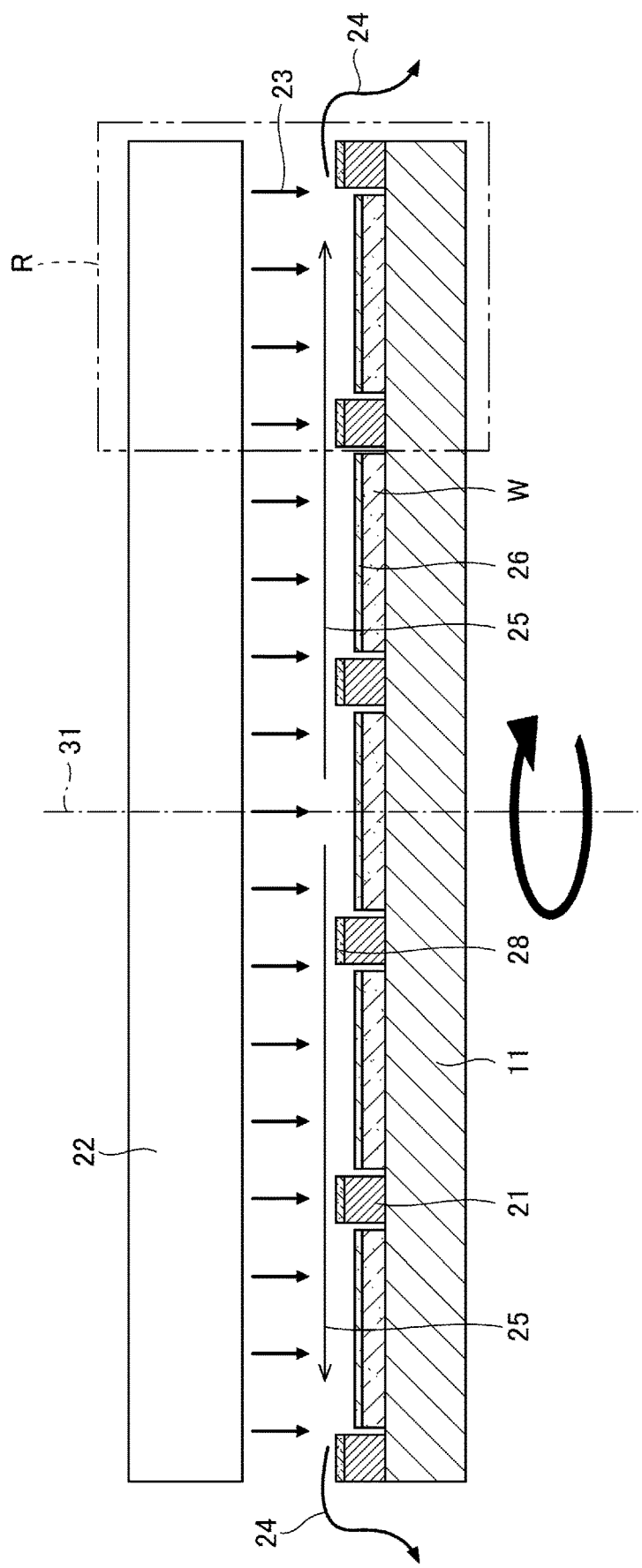
FIG. 1 is a schematic diagram illustrating an example of an inside of a film formation chamber used in an MOCVD method.

In a conventional manufacturing method of a semiconductor device, when a size of the susceptor is increased in order to increase the number of wafers placed on one susceptor, the amount of change in the direction or the magnitude of the warp of the susceptor after replacement of the susceptor increases. For this reason, the number of trial productions for determining mass-production film formation conditions suitable for mass production increases.

It is desirable to provide a method of manufacturing a semiconductor device capable of reducing the number of trial productions.

First, embodiments of the present disclosure will be listed and described.

[1] A method of manufacturing a semiconductor device according to an embodiment of the present disclosure includes attaching a first susceptor to a film forming apparatus, measuring a magnitude of a warp of the first susceptor, setting a first initial film formation condition as a film formation condition of the film forming apparatus in accordance with the measured magnitude of the warp of the first susceptor, and placing a plurality of first wafers on the first susceptor and forming a first film on the plurality of first wafers under the film formation condition. The setting of the first initial film formation condition includes reading the first initial film formation condition from a recording medium storing a database. The database includes a plurality of pieces of data in which magnitudes of warps of susceptors are associated with initial film formation conditions for forming the first film.

The database contains a plurality of pieces of data associating the magnitude of the warp of the susceptor with the initial film formation condition when the first film is formed. Therefore, after the susceptor is attached, the initial film formation condition corresponding to the magnitude of the warp of the susceptor is read from the database, and a trial production is started from the initial film formation condition, whereby the mass-production film formation condition can be determined with a small number of trial productions.

[2] In the method according to one embodiment noted above under [1], the film forming apparatus may include a plurality of heaters configured to heat the first susceptor. The film formation condition may include a set temperature of each of the plurality of heaters. In this case, it is easy to determine a heater balance suitable for mass production with a small number of trial productions.

[3] In the method according to one embodiment noted above under [2], the plurality of heaters may be disposed concentrically. In this case, it is easy to control the temperature of the plurality of first wafers concentrically placed on the susceptor.

[4] In the method according to one embodiment noted above under [1] to [3], the forming of the first film may include causing epitaxial growth of a semiconductor film by metal organic chemical vapor deposition. In this case, it is easy to determine mass-production film formation conditions for semiconductor films such as nitride semiconductor films.

[5] According to one embodiment noted above under [1] to [4], the method may further include acquiring a first distribution of a thickness of the first film on the first wafers after the forming of the first film, and determining the first initial film formation condition as a mass-production film formation condition when the acquired first distribution satisfies a predetermined film thickness distribution condition. In this case, mass production can be quickly started.

[6] According to one embodiment noted above under [5], the method may further include repeating steps when the first distribution does not satisfy the predetermined film thickness distribution condition, until the first distribution satisfies the predetermined film thickness distribution condition, the steps including changing the film formation condition in accordance with the first distribution, replacing the plurality of first wafers, forming the first film on the plurality of replaced first wafers under the changed film formation condition, and acquiring the first distribution of a thickness of the first film, and determining a previous film formation condition as the mass-production film formation condition, the previous film formation condition being used when the first distribution satisfies the predetermined film thickness distribution condition. In this case, mass-production film formation conditions can be determined with a small number of trial productions.

[7] According to one embodiment noted above under [5] or [6], the method may further include placing a plurality of second wafers on the first susceptor and forming the first film on the plurality of second wafers under the mass-production film formation condition after the determining of the mass-production film formation condition. In this case, productivity can be improved by mass production of the first film.

[8] According to one embodiment noted above under [5] to [7], the method may include additionally recording data, in which the magnitude of the warp of the first susceptor is associated with the mass-production film formation condition, in the recording medium storing the database after the determining of the first initial film formation condition as the mass-production film formation condition. In this case, the number of trial productions at the time of subsequent replacement of the susceptor can be more easily reduced by the enrichment of data.

[9] In the method according to one embodiment noted above under [1] to [8], the database may be stored in an external recording medium connected to an outside of the film forming apparatus via a communication line. The plurality of pieces of data may be added to the database from the outside of the film forming apparatus via the communication line. In this case, the database can be constructed without using the film forming apparatus.

[10] In the method according to one embodiment noted above under [9], the first susceptor may have a serial number, and the plurality of pieces of data may be added to the database in accordance with the serial number. In this case, for example, a vendor of the susceptor can add a plurality of pieces of data to the database.

Details of Embodiments of the Present Disclosure

Hereinafter, embodiments of the present disclosure will be described in detail, but the present disclosure is not limited thereto. In the specification and the drawings, components having substantially the same functional configuration are denoted by the same reference numerals, and redundant description thereof may be omitted.

First, a relationship between the shape of a susceptor and a film thickness distribution of a semiconductor film when the semiconductor film is formed by a metal organic chemical vapor deposition (MOCVD) method will be described.

FIG. 1 is a schematic diagram illustrating an inside of a film formation chamber used in the MOCVD method. FIG. 1 illustrates a susceptor 11 which has a circular planar shape and on which five wafers W can be placed along two indicated radial directions of susceptor 11. No warp occurs in susceptor 11, and an upper surface of susceptor 11 is flat. On the upper surface of susceptor 11, walls 21 for restricting lateral movement of wafers W are provided so as to surround each wafer W. A shower head 22 is installed above susceptor 11, a raw material gas 23 is injected from shower head 22 toward wafers W, and a semiconductor film 26 is formed on each surface of wafers W facing shower head 22. During film formation, susceptor 11 rotates with the center as a revolution axis 31. Raw material gas 23 is injected from shower head 22 directly above toward wafers W, and there are flows 25 of raw material gas 23 from the center of susceptor 11 toward outer peripheries. Portions of raw material gas 23 that have not been consumed in the film formation become exhaust gases 24 and are exhausted to the outside of susceptor 11. Here, a GaN film is formed as the semiconductor film. In FIG. 1, a region R surrounded by a two-dot chain line is a region located on one of the outermost peripherals among five regions, each on which wafer W is placed, in the two indicated radial directions. When susceptor 11 is repeatedly used, a deposit 28 of GaN is formed on each wall 21.

Figure 2:
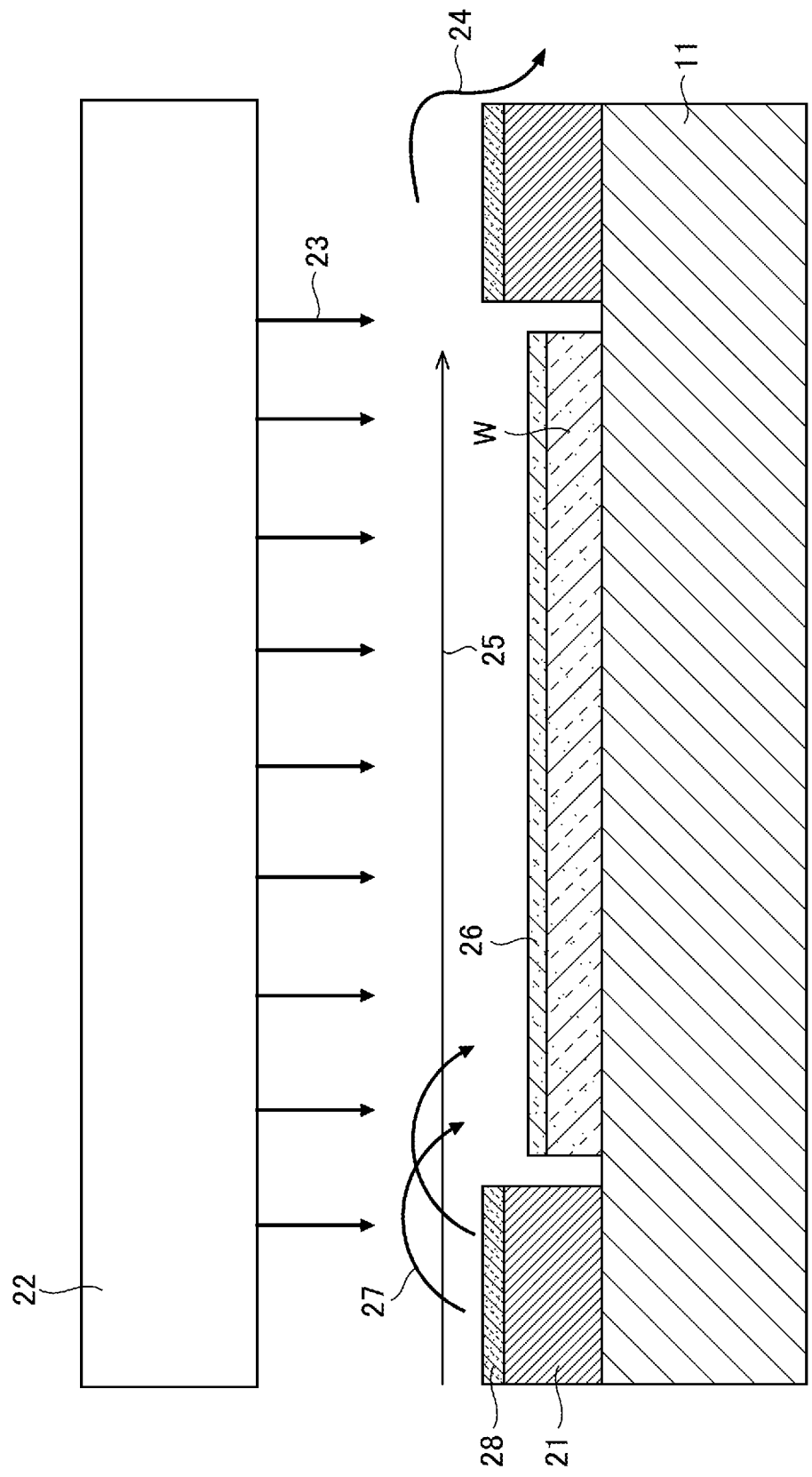
FIG. 2 is an enlarged schematic diagram illustrating a region R in FIG. 1.
Figure 3:
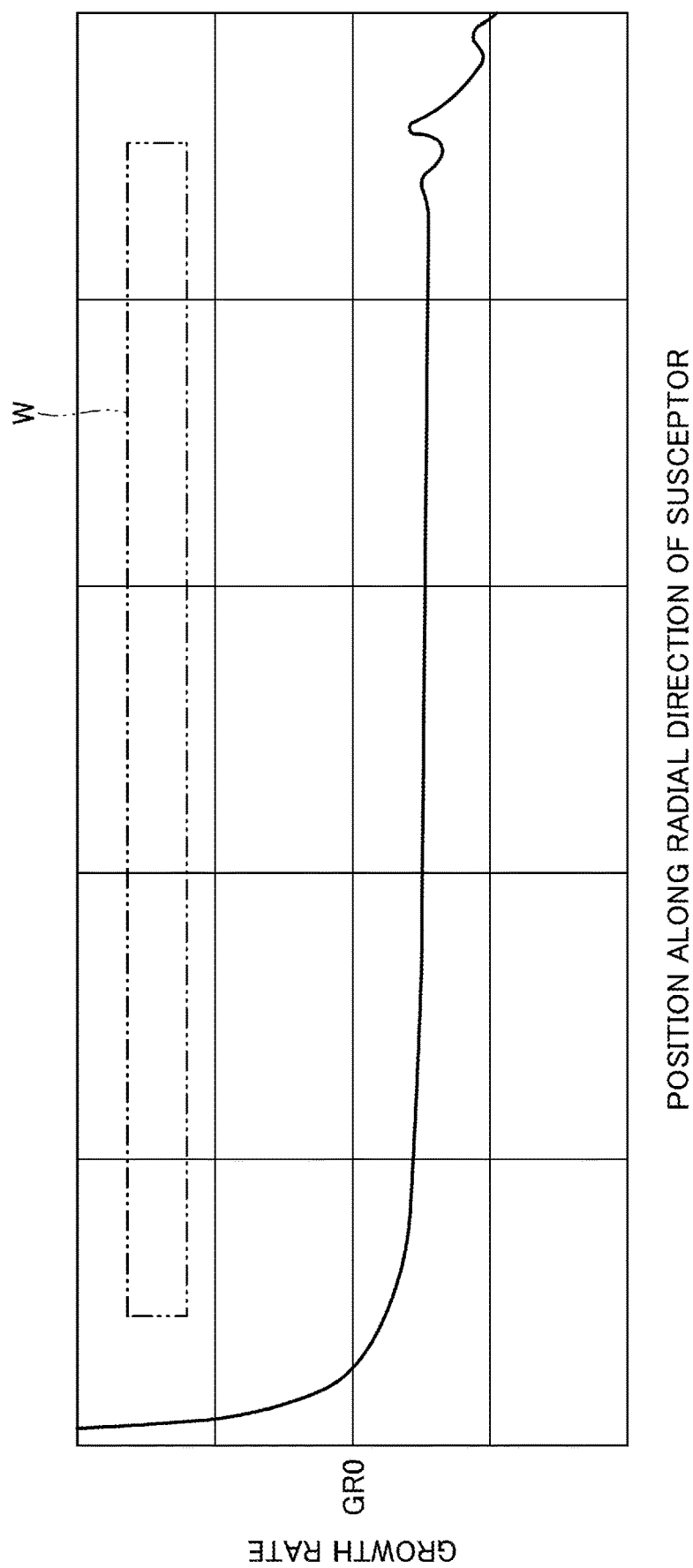
FIG. 3 is a diagram illustrating a distribution of a growth rate of a GaN film formed on a wafer in the region R in FIG. 1.

FIG. 2 is an enlarged schematic diagram illustrating region R in FIG. 1. FIG. 3 is a diagram illustrating a distribution of a growth rate of the GaN film famed on wafer W in region R in FIG. 1. FIG. 3 indicates a result of a simulation. In FIG. 3, the horizontal axis represents a position along the radial direction of susceptor 11, and the vertical axis represents the growth rate of the GaN film. In the vertical axis, a growth rate GR0 is designated as a reference for comparison with FIG. 6 and FIG. 9 described later. In this simulation, it is assumed that a temperature T of susceptor 11 is uniform in the whole area of the susceptor.

As illustrated in FIG. 2, in region R, raw material gas 23 is injected from shower head 22 directly above toward wafer W, and there is flow 25 of raw material gas 23 from the center of susceptor 11 toward the outer periphery. When susceptor 11 is repeatedly used, deposit 28 of GaN is also famed on each wall 21. For this reason, Ga is sublimated from deposit 28 on wall 21 closer to the center of susceptor 11, and a Ga sublimation gas 27 flows into region R. Therefore, as indicated in FIG. 3, even if susceptor 11 without warp is used and the temperature of susceptor 11 is uniform in the whole area of the susceptor, the growth rate is not uniform. More specifically, in region R of susceptor 11, the growth rate is larger on the position closer to the center and becomes smaller toward the outer periphery. Since the film thickness of the GaN film depends on the growth rate, the film thickness distribution of the GaN film is similarly in accordance.

Figure 4:
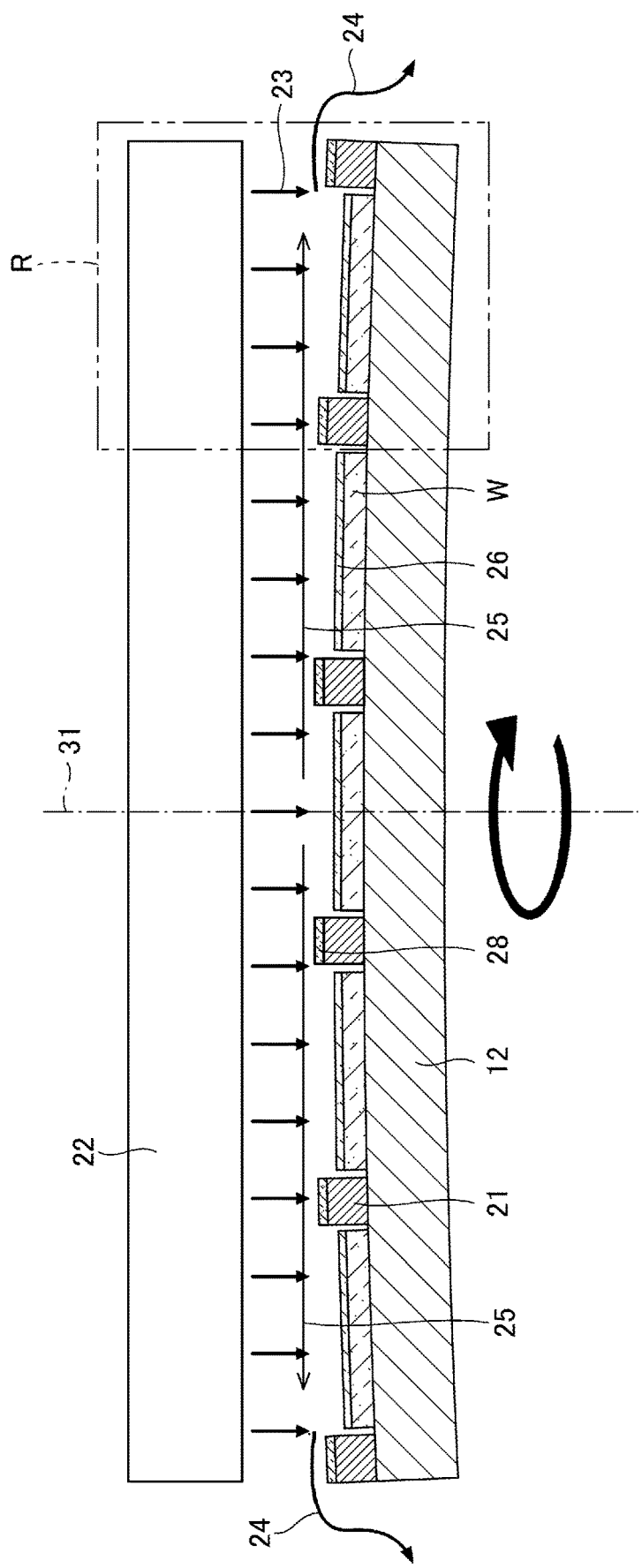
FIG. 4 is a schematic diagram illustrating another example of the inside of a film formation chamber used in an MOCVD method.

Next, a distribution of a growth rate will be described in a case where a susceptor having a convex warp is used. FIG. 4 is a schematic diagram illustrating another example of an inside of a film formation chamber used in the MOCVD method. FIG. 4 illustrates a susceptor 12 which has a circular planar shape and on which five wafers W can be placed along two indicated radial directions. The convex warp occurs in susceptor 12. Except for the warp, susceptor 12 has the same configuration as susceptor 11.

Figure 5:
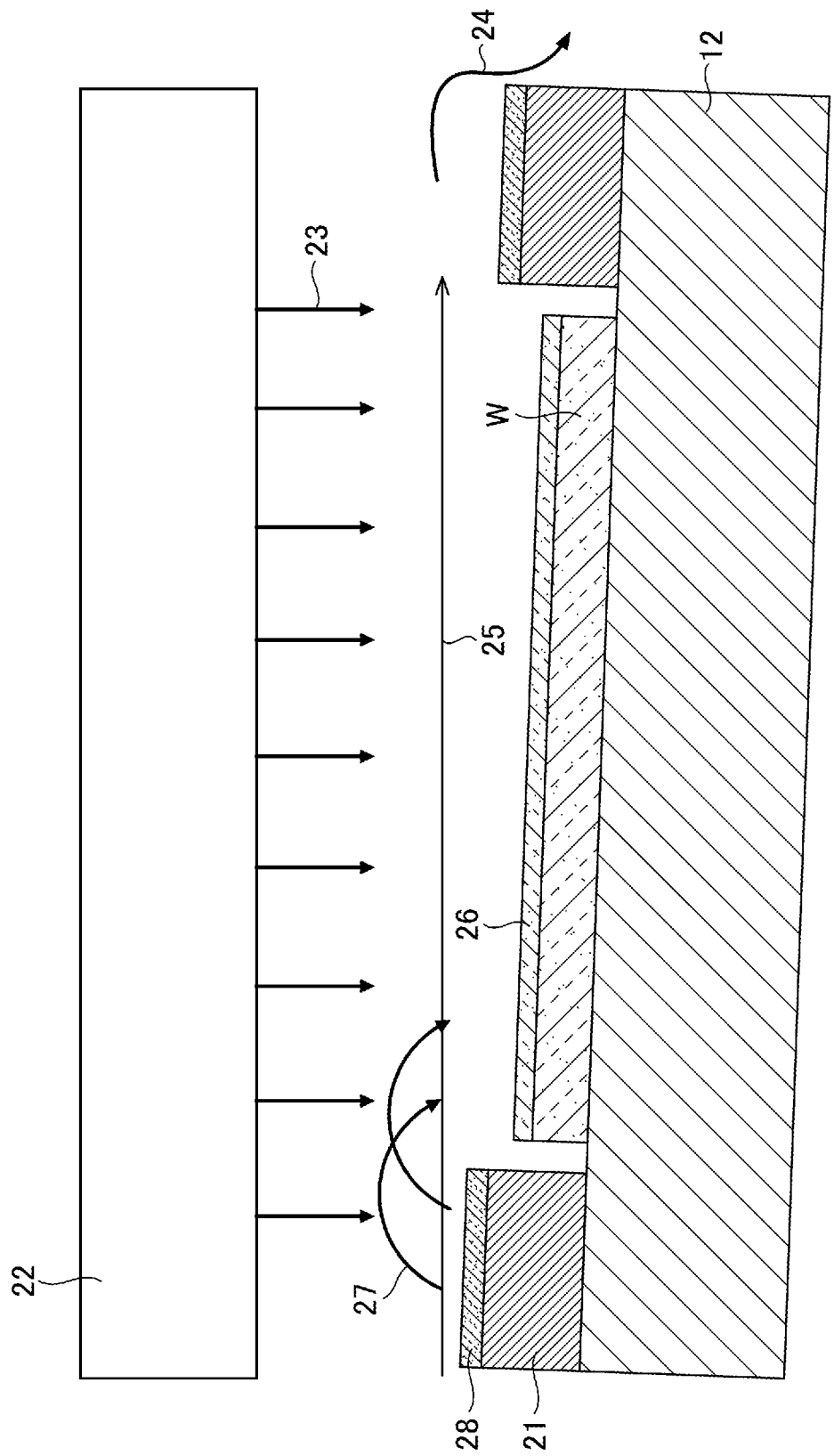
FIG. 5 is an enlarged schematic diagram illustrating a region R in FIG. 4.
Figure 6:
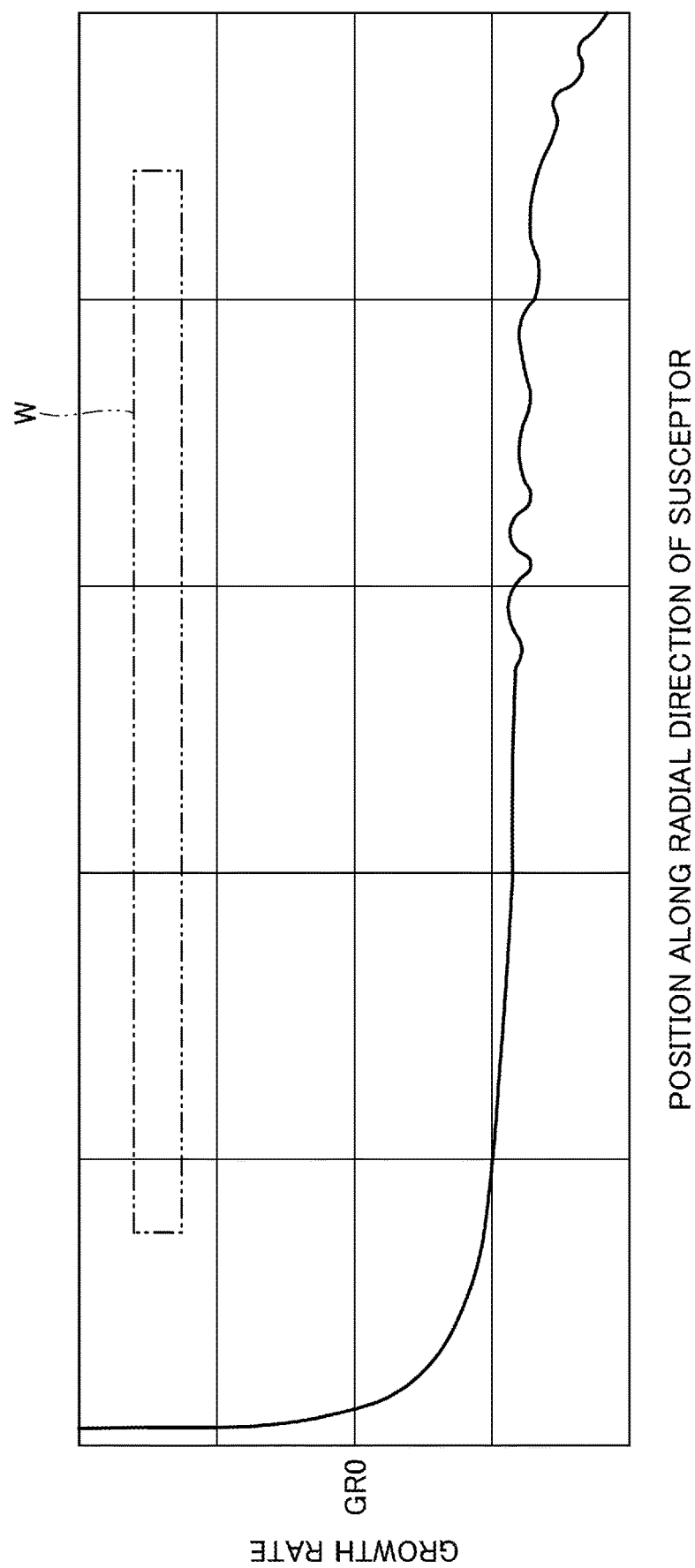
FIG. 6 is a diagram illustrating a distribution of a growth rate of a GaN film formed on a wafer in the region R in FIG. 4.

FIG. 5 is an enlarged schematic diagram illustrating region R in FIG. 4. FIG. 6 is a diagram illustrating a distribution of a growth rate of a GaN film formed on wafer W in region R in FIG. 4. FIG. 6 indicates a result of the simulation. In FIG. 6, the horizontal axis represents a position along the radial direction of susceptor 12, and the vertical axis represents the growth rate of the GaN film. In this simulation, temperature T of susceptor 12 is assumed to be uniform in the whole area of the susceptor.

As illustrated in FIG. 5, when susceptor 12 having the convex warp is used, a distance between wafer W and shower head 22 in region R is larger than that when susceptor 11 having no warp is used. Thus, due to flow 25, a proportion of raw material gas 23 that becomes exhaust gas 24 before reaching wafer W is high. Therefore, as indicated in FIG. 6, compared with the result of FIG. 3, the growth rate is low as a whole area, and the growth rate on an area closer to the outer periphery decreases remarkably in region R.

Figure 7:
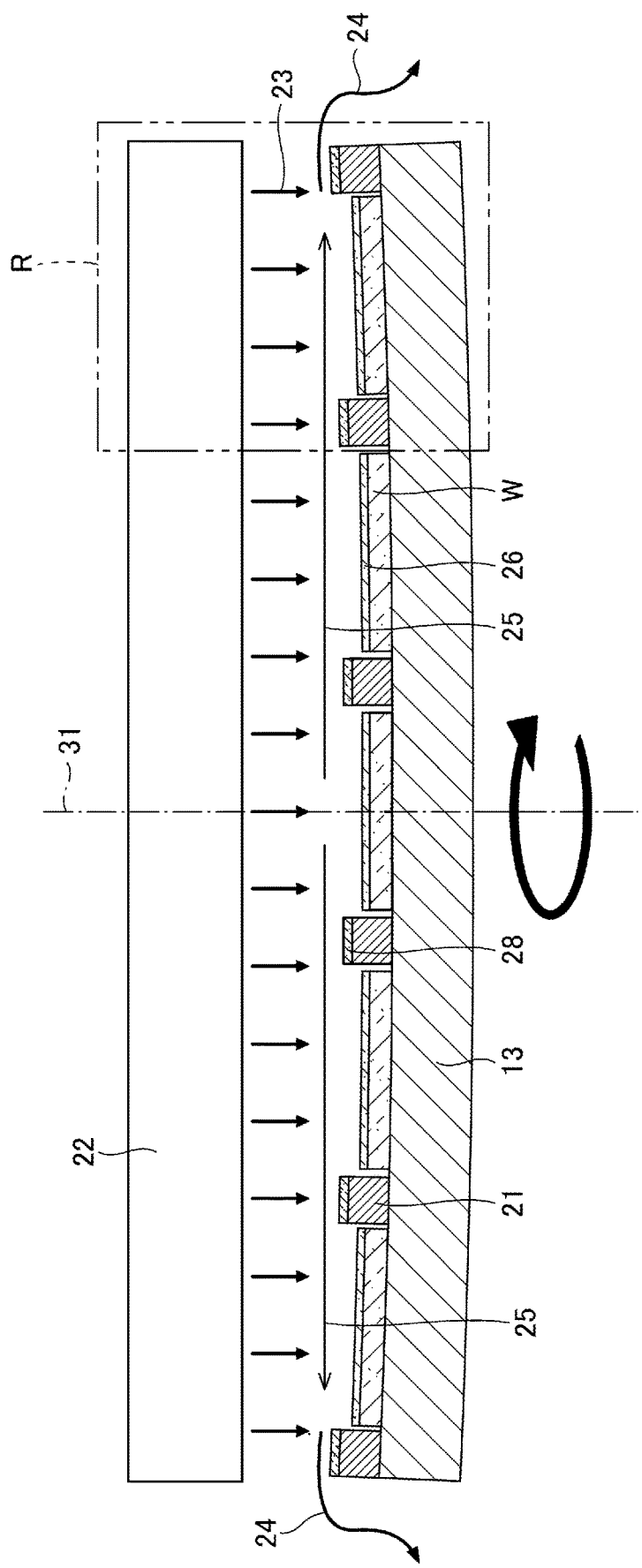
FIG. 7 is a schematic diagram illustrating still another example of an inside of a film formation chamber used in an MOCVD method.

Next, distributions of a growth rate will be described in a case where a susceptor having a concave warp is used. FIG. 7 is a schematic diagram illustrating still another example of an inside of a film formation chamber used in the MOCVD method. FIG. 7 illustrates a susceptor 13 which has a circular planar shape and on which five wafers W can be placed in two indicated radial directions. The concave warp occurs in susceptor 13. Except for the warp, susceptor 13 has the same configuration as susceptor 11.

Figure 8:
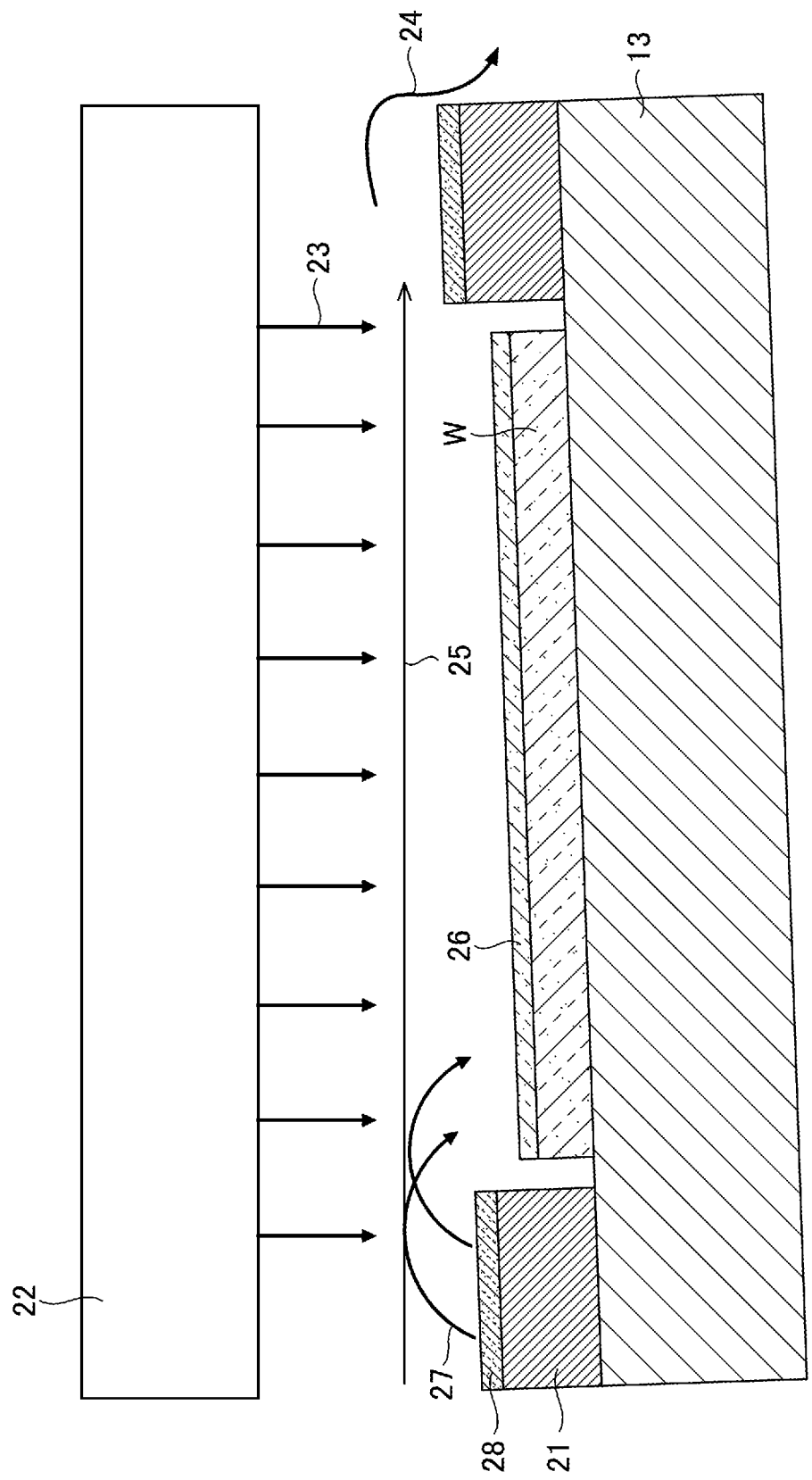
FIG. 8 is an enlarged schematic diagram illustrating a region R in FIG. 7.
Figure 9:
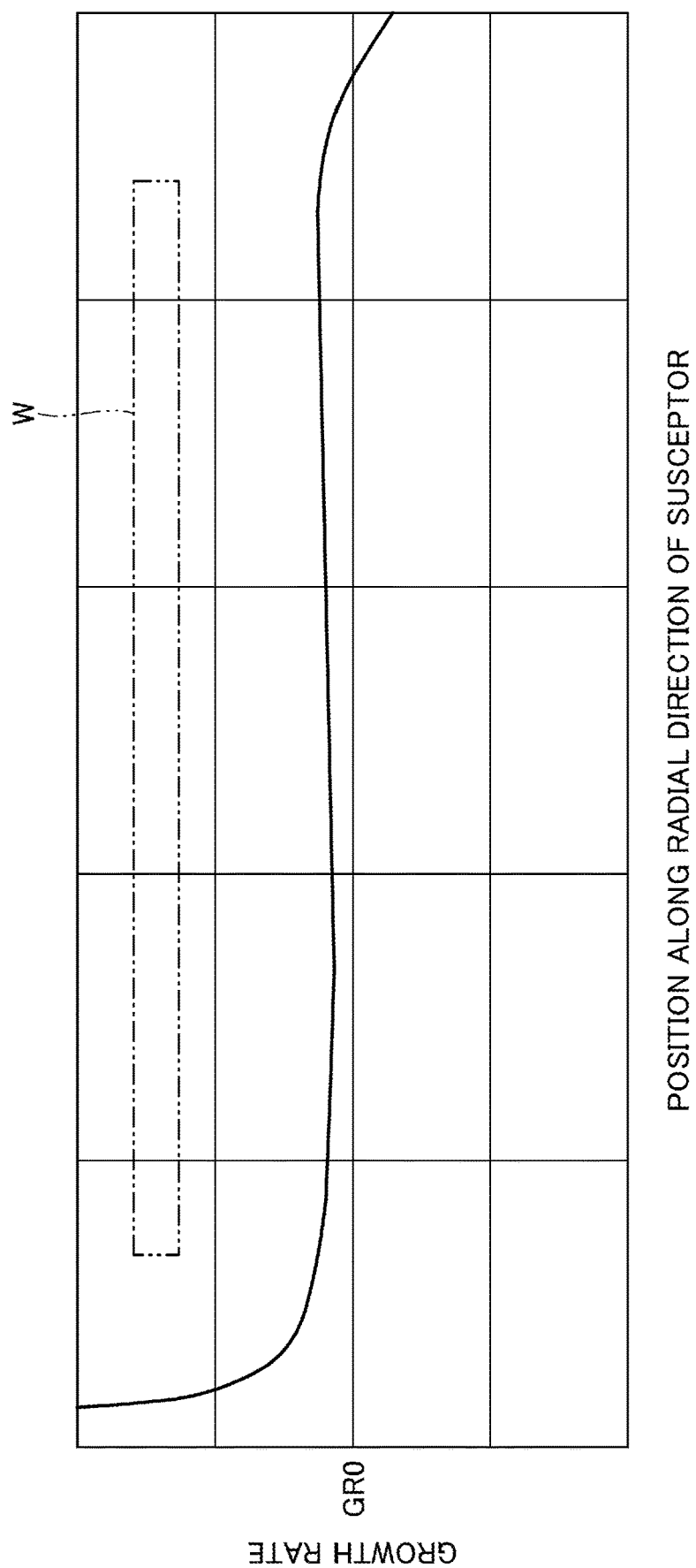
FIG. 9 is a diagram illustrating a distribution of a growth rate of a GaN film formed on a wafer in the region R in FIG. 7.

FIG. 8 is an enlarged schematic diagram illustrating region R in FIG. 7. FIG. 9 is a diagram illustrating a distribution of a growth rate of a GaN film formed on wafer W in region R in FIG. 7. FIG. 9 indicates a result of the simulation. In FIG. 9, the horizontal axis represents a position along the radial direction of susceptor 13, and the vertical axis represents the growth rate of the GaN film. In this simulation, temperature T of susceptor 13 is assumed to be uniform in the susceptor.

As illustrated in FIG. 8, when susceptor 13 having the concave warp is used, the distance between wafer W and shower head 22 in region R is smaller than that when susceptor 11 having no warp is used. Therefore, due to flow 25, the proportion of raw material gas 23 that becomes exhaust gas 24 before reaching wafer W is low. Therefore, as indicated in FIG. 9, compared with the example of FIG. 3, the growth rate is high as a whole, and the decrease in the growth rate on the outer peripheral side is concealed in region R.

Figure 10:
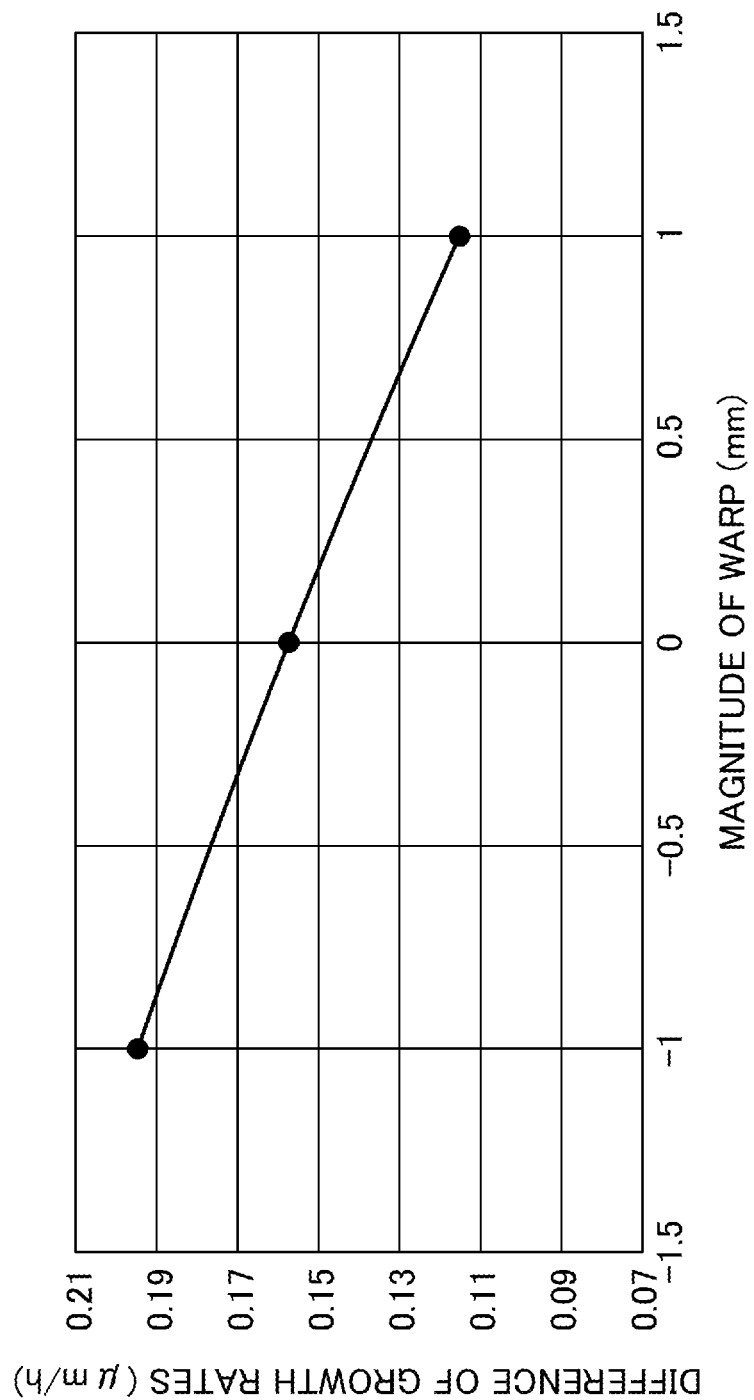
FIG. 10 is a diagram illustrating an example of a relationship between a magnitude of a warp of a susceptor and a difference in growth rate.

FIG. 10 is a diagram indicating an example of a relationship between a magnitude of the warp of the susceptor and a difference in growth rate. The horizontal axis of FIG. 10 represents the magnitude of the warp of the susceptor. The magnitude of the warp indicates a height of the outer periphery with reference to the center of the susceptor. When the magnitude of the warp is positive, the susceptor is warped in the concave shape. When the magnitude of the warp is negative, the susceptor is warped in a convex shape. The vertical axis of FIG. 10 represents the difference in growth rate. FIG. 10 indicates an outline of a tendency of the difference of the growth rates, in a plane of wafer W, between at the region closest to the center of the susceptor in wafer W and at the region farthest from the center of the susceptor. As indicated in FIG. 10, the difference in growth rate in the plane of wafer W is affected by the magnitude of the warp of the susceptor. In the example indicated in FIG. 10, the difference in growth rate is smaller when the susceptor has the concave shape than the difference in growth rate when the susceptor has the convex shape.

As described with reference to FIG. 1 to FIG. 10, even if the film formation conditions such as the in-plane temperature of the susceptor are uniform and common, the growth rate and the film thickness distribution of a film such as a GaN film differ depending on a form of the warp of the susceptor. Therefore, after the susceptor is replaced, it is desirable to specify a mass-production film formation condition so that uniformity of the in-plane film thickness of each wafer in the susceptor after the replacement becomes a value suitable for mass production.

Reference Example

Figure 11:
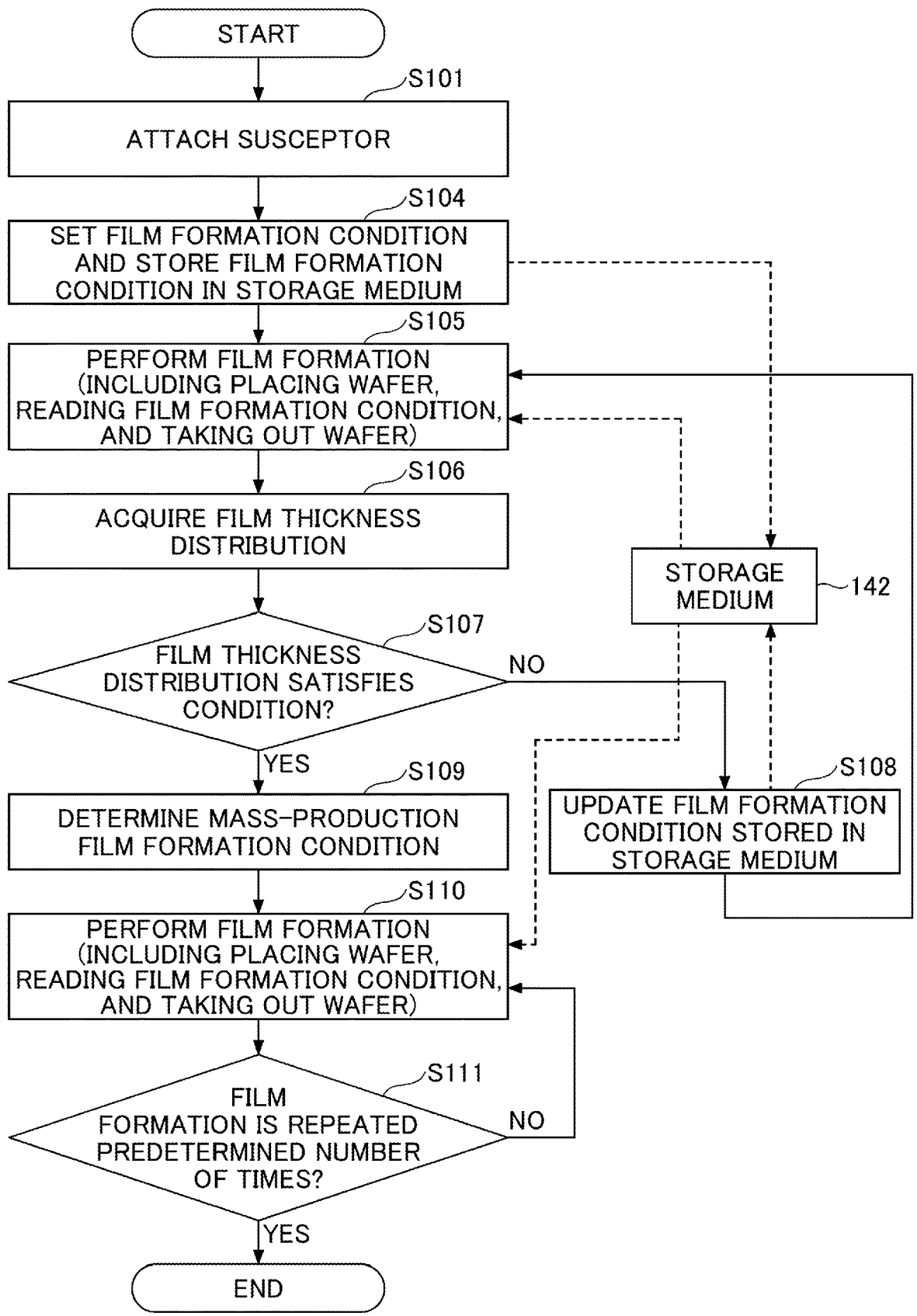
FIG. 11 is a flowchart illustrating a method of manufacturing a semiconductor device according to a reference example.

Next, a method of manufacturing a semiconductor device according to a reference example will be described. Here, a description will be given of processing from a replacement of a susceptor to specifying a mass-production film formation condition suitable for mass production and performing a film formation under the mass-production film formation condition. FIG. 11 is a flowchart indicating a method of manufacturing a semiconductor device according to the reference example.

First, a new susceptor is attached to the film formation chamber (step S101) in the method of manufacturing the semiconductor device according to the reference example. Next, a film formation condition for the film formation performed first after the replacement of the susceptor is stored in a storage medium 142 such as a memory (step S104). The film formation condition includes a temperature setting condition of a heater for heating the susceptor. The same condition is always used as the film formation condition performed first after each replacement. Next, a plurality of wafers are placed on the susceptor, the film formation condition is read from storage medium 142, and a semiconductor film such as a GaN film is formed on the plurality of wafers under the read film formation condition. Then, the plurality of wafers each on which the film formation has been performed are taken out from the film formation chamber (step S105). Next, film thicknesses of the semiconductor film are measured at a plurality of positions to acquire a film thickness distribution (step S106). Next, it is determined whether or not the film thickness distribution satisfies a predetermined film thickness distribution condition (step S107).

If the film thickness distribution does not satisfy the film thickness distribution condition, the film formation condition is changed according to the film thickness distribution, and information of the film formation condition stored in storage medium 142 is updated (step S108). Then, in step S105, a plurality of wafers are placed on the susceptor, the updated film formation condition is read from storage medium 142, a semiconductor film such as a GaN film is formed on the plurality of wafers under the read film formation condition, and the plurality of wafers each on which the semiconductor film is formed are taken out to the outside of the film forming apparatus (step S105). Thereafter, the processing from step S105 to step S108 is repeated as a trial production until the film thickness distribution satisfies the film thickness distribution condition.

When the film thickness distribution satisfies the film thickness distribution condition, the film formation condition in the immediately preceding film formation is determined as the mass-production film formation condition (step S109). Then, a plurality of wafers are placed on the susceptor, the film formation condition is read from storage medium 142, a film formation is performed under the read film formation condition, and the plurality of wafers each on which the film formation has been performed are taken out from the film formation chamber (step S110). As a mass production process, the film formation on a plurality of wafers is repeated a predetermined number of times (step S111).

For sake of simplicity of the flowchart, step S105 is illustrated as a process different from step S110, but both steps are performed by the same film formation chamber using the same susceptor or the like.

By such a method, the mass-production film formation condition can be determined, and film formations can be performed under the mass-production film formation condition.

However, since the film formation conditions for the film formation performed first after the replacement of the susceptor in step S104 are always fixed regardless of the magnitudes of the warps of the susceptors, the frequency of repetition of the processing from step S105 to step S108 increases as the size of the susceptor increases. For this reason, the time from the replacement of the susceptor to the start of mass production becomes long, and an improvement in productivity is suppressed. In addition, when the number of trial productions increases until the film formation condition suitable for mass production is set, the number of wafers used and the amount of raw material gases used in the trial productions increase, which leads to an increase in the cost of members provided to a final mass-produced product.

Figure 12:
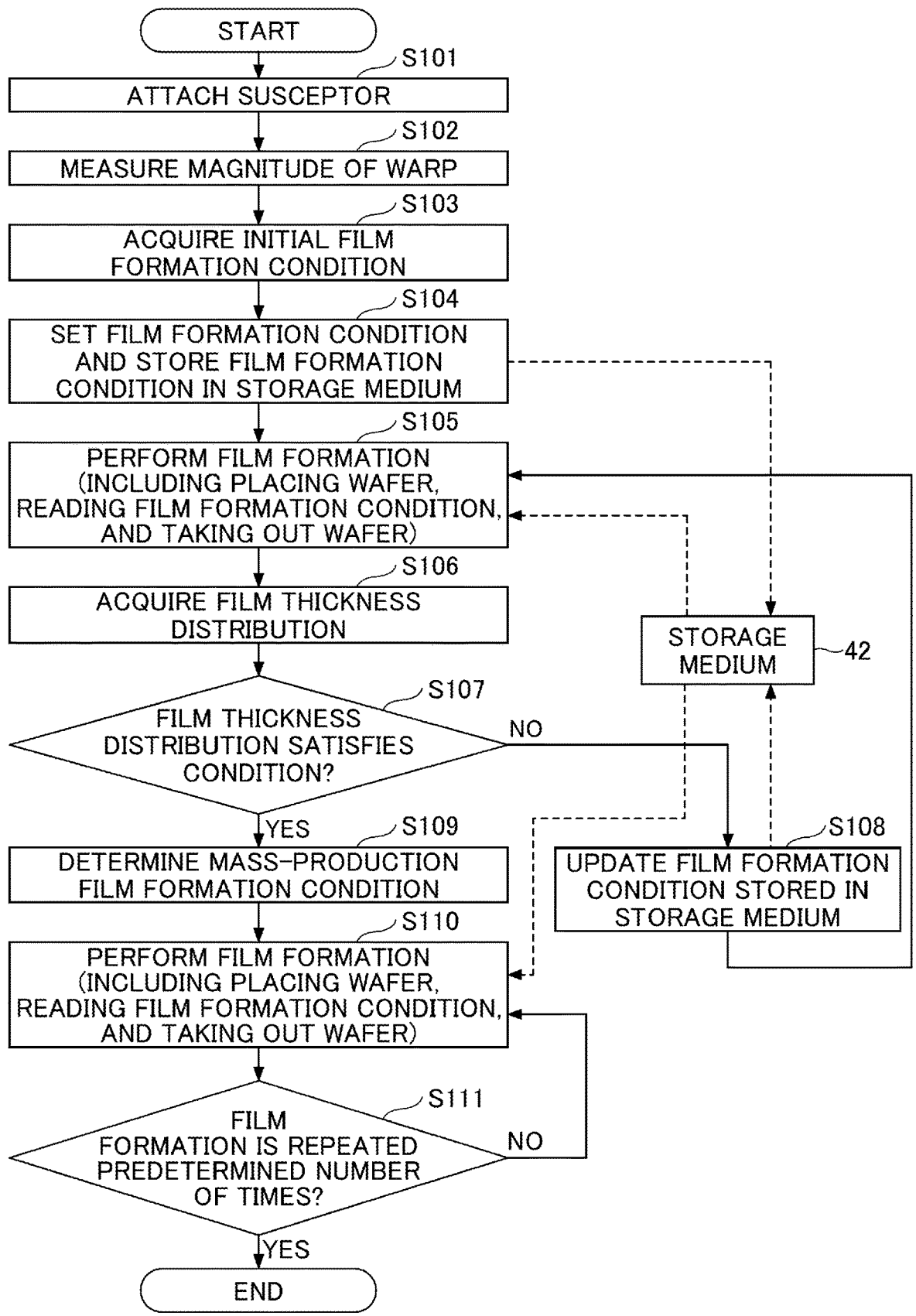
FIG. 12 is a flowchart illustrating a method of manufacturing a semiconductor device according to an embodiment.
Figure 13:
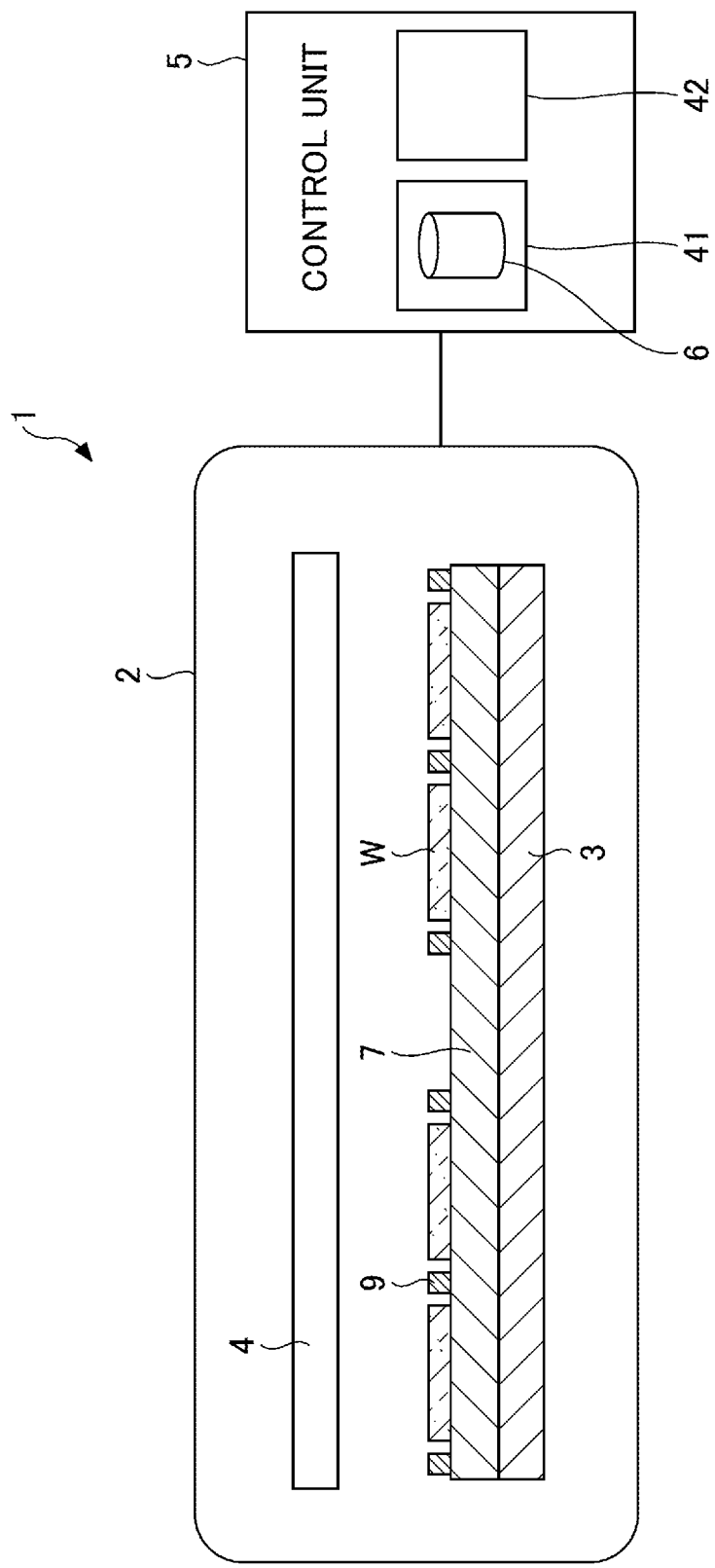
FIG. 13 is a schematic diagram illustrating a film forming apparatus used in a method of manufacturing a semiconductor device according to the embodiment.

Methods of manufacturing a semiconductor device according to embodiments described below are intended to reduce the frequency of repetition of processing from step S105 to step S108. FIG. 12 is a flowchart indicating a method of manufacturing a semiconductor device according to an embodiment. FIG. 13 is a schematic diagram illustrating a film forming apparatus used in a method of manufacturing a semiconductor device according to an embodiment.

A film forming apparatus 1 used in the method of manufacturing a semiconductor device according to the embodiment illustrated in FIG. 13 is, for example, an MOCVD apparatus, and includes a film formation chamber 2, a heater unit 3, a shower head 4, and a control unit 5. In the method of manufacturing the semiconductor device according to the embodiment, a semiconductor film is epitaxially grown by the MOCVD method. Heater unit 3 and shower head 4 are disposed in film formation chamber 2. A susceptor 7 having walls 9 is mounted on heater unit 3, and heater unit 3 heats susceptor 7. Shower head 4 sprays a raw material gas toward a plurality of wafers W placed on susceptor 7. Control unit 5 controls heater unit 3, shower head 4, and the like. Control unit 5 has a recording medium 41 such as a hard disk drive storing a database 6, and a storage medium 42 such as a memory storing data such as film formation conditions.

Although FIG. 13 illustrates an embodiment in which film forming apparatus 1 includes control unit 5, film forming apparatus 1 does not necessarily include control unit 5. Control unit 5 may be provided outside and connected to film forming apparatus 1 via a communication line or the like. Database 6 may also have a form in which data can be written from the outside via a communication line or the like. In this case, the database 6 is stored in an outside recording medium connected to the outside of film forming apparatus 1 via a communication line. An outside vendor providing susceptors 7 may write or add data of the warp or the like of each susceptor 7 accompanied by its serial number that can identify each of susceptors 7 into database 6 from the outside.

Figure 14:
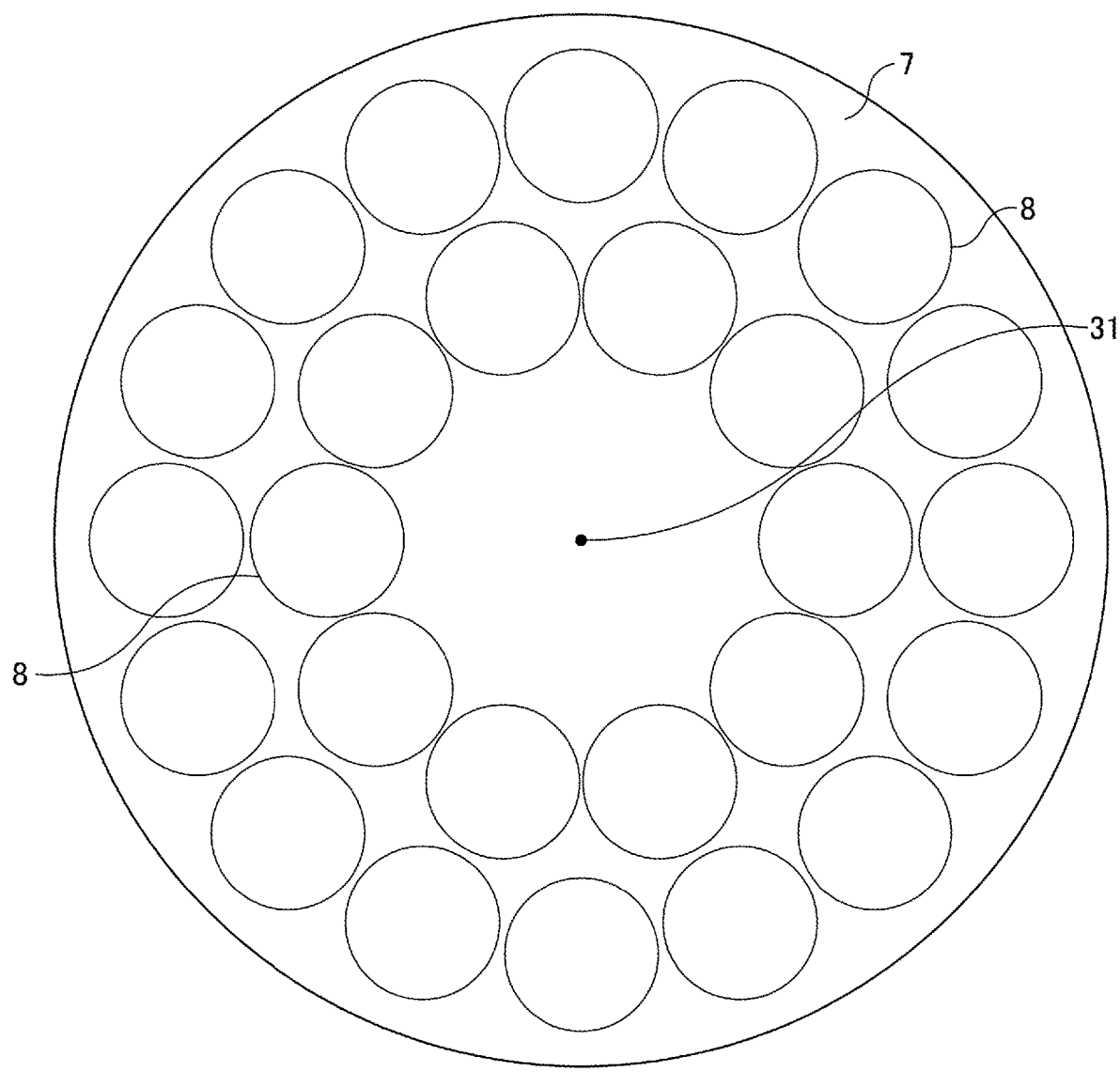
FIG. 14 is a schematic diagram illustrating a susceptor.
Figure 15:
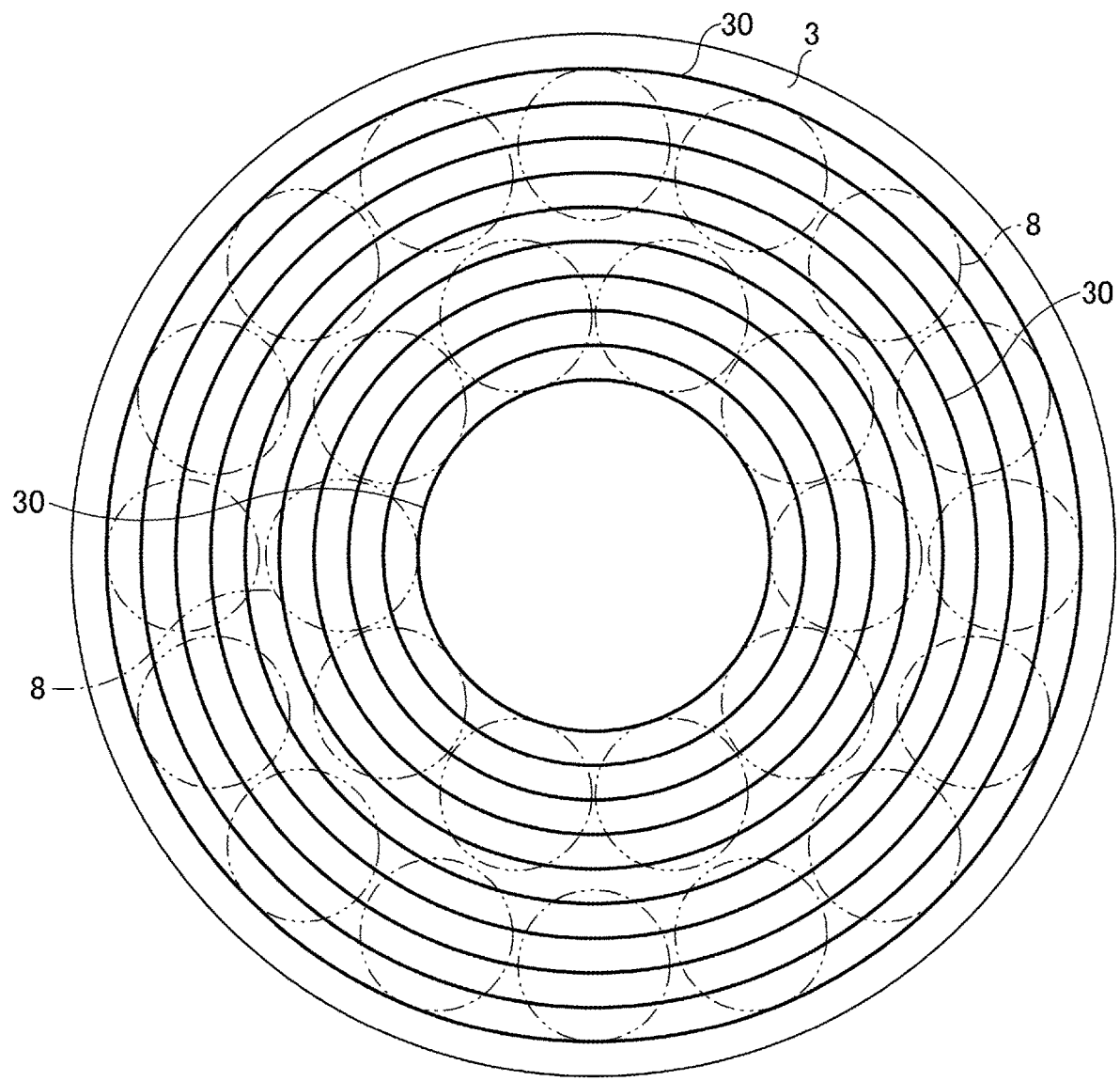
FIG. 15 is a schematic diagram illustrating a heater unit.

Here, heater unit 3 will be described. FIG. 14 is a schematic diagram illustrating susceptor 7. FIG. 14 is a diagram illustrating a structure of an upper surface of susceptor 7 facing shower head 4. FIG. 15 is a schematic diagram illustrating heater unit 3. FIG. 15 is a diagram illustrating a structure of an upper surface of heater unit 3 opposed to a lower surface of susceptor 7. As illustrated in FIG. 14, susceptor 7 has, for example, ten pocket regions 8 on one circumference on which wafers W are placed, and further has sixteen pocket regions 8 on the other circumference outside thereof. That is, susceptor 7 is configured such that 26 wafers W can be placed thereon. Although not illustrated in FIG. 14, a wall similar to wall 21 is provided around pocket region 8. As illustrated in FIG. 15, heater unit 3 has a plurality of heaters 30 arranged concentrically. Heater 30 is disposed so as to overlap pocket region 8. Each temperature of each of the plurality of heaters 30 can be controlled independently. Therefore, by adjusting set temperatures of the plurality of heaters 30, it is possible to adjust a balance (heater balance) of heat radiation temperatures that differ depending on concentric positions in heater units 3.

Database 6 includes a plurality of pieces of data in which the magnitude of the warp of the susceptor is associated with an initial film formation condition for the film formation in which a semiconductor film is famed for the first time after the replacement of the susceptor. The initial film formation condition includes, for example, initial set temperatures of the plurality of heaters 30. That is, in database 6, the data of the condition related to an initial heater balance of heater unit 3 is recorded in association with the magnitude of the warp of the susceptor. For example, database 6 stores three data of the initial heater balances including an initial heater balance when the magnitude of the warp of the susceptor is −1 mm, an initial heater balance when the magnitude of the warp of the susceptor is +0.5 mm, and an initial heater balance when the magnitude of the warp of the susceptor is +1.0 mm. Database 6 preferably includes a larger number of pieces of data.

In the method of manufacturing the semiconductor device according to the embodiment, as indicated in FIG. 12, a new susceptor 7 is attached to film formation chamber 2 (step S101). Specifically, susceptor 7 is mounted on heater unit 3. Susceptor 7 is an example of a first susceptor.

Figure 16:
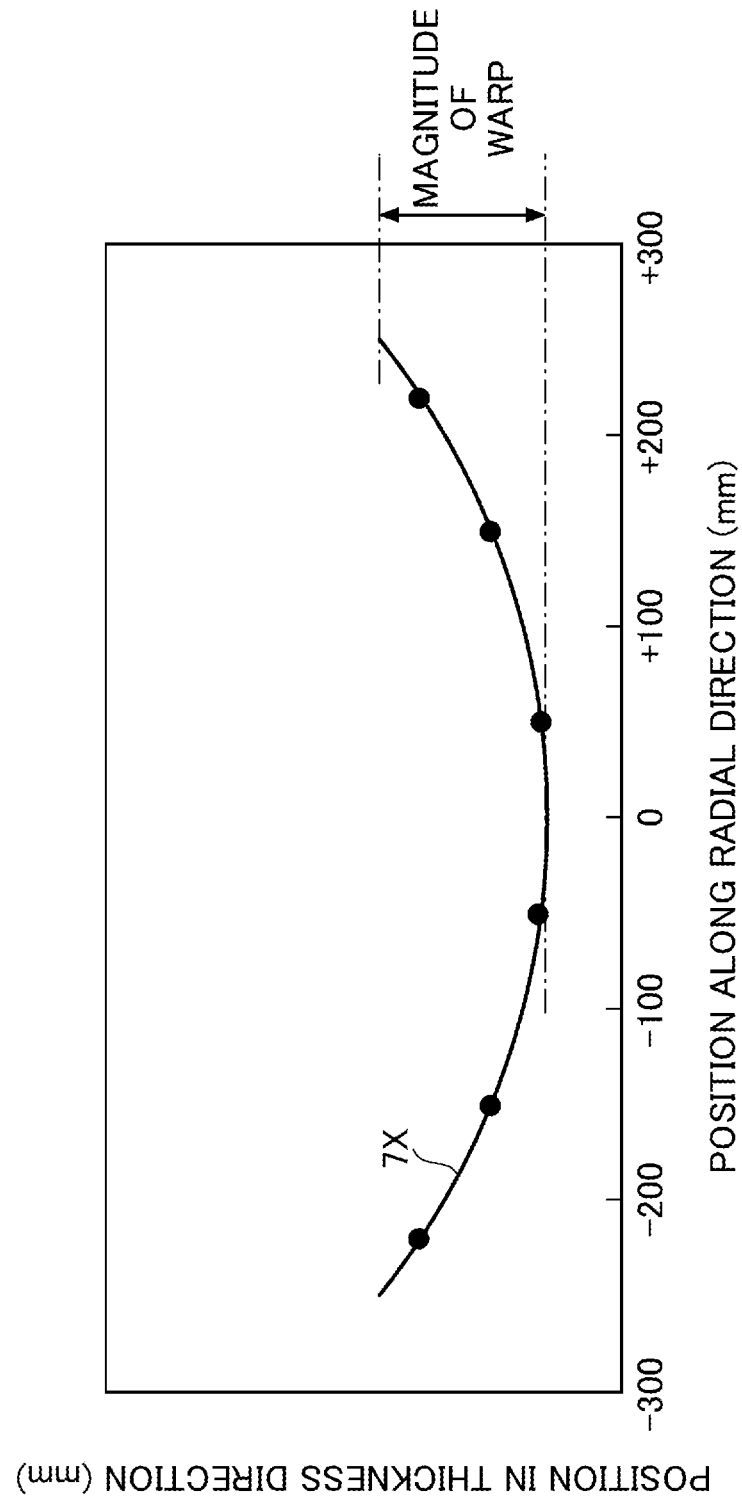
FIG. 16 is a diagram illustrating a method of approximating a shape of a surface of a susceptor.

Next, a magnitude of a warp of susceptor 7 is measured and acquired (step S102). The magnitude of the warp of susceptor 7 is a height difference between the highest position and the lowest position of the surface of susceptor 7. Here, as an example, when susceptor 7 is warped in a concave shape, that is, when the center is lower than the outer periphery, the height difference is positive, and when susceptor 7 is warped in a convex shape, that is, when the center is higher than the outer periphery, the height difference is negative. The position of the surface of susceptor 7 can be measured using, for example, a contact or non-contact displacement meter. In measuring the shape of susceptor 7, it is not necessary to measure the position of the entire surface of susceptor 7. For example, the position may be measured at three or more points between the center and the outer periphery, and the shape of susceptor 7 may be approximated to a circular arc from the result. FIG. 16 is a diagram indicating a method of approximating the shape of the surface of susceptor 7. In the example indicated in FIG. 16, the diameter of susceptor 7 is 500 mm, and the shape of the surface of susceptor 7 is approximated to a circular arc 7X by measuring the positions of a total of six points on a straight line passing through the center, and the six points consist of two points away from the center by 50 mm, two points away from the center by 150 mm, and two points away from the center by 220 mm.

A mechanism for measuring the magnitude of the warp of susceptor 7 may be provided outside film forming apparatus 1. The magnitude of the warp of susceptor 7 may be obtained before being attached to film formation chamber 2. Alternatively, the magnitude of the warp of susceptor 7 may be provided in advance together with related information from a manufacturer (outside vendor) of susceptor 7 in accordance with individual identification information such as the serial number of susceptor 7. These pieces of related information may be stored in database 6 in advance from the outside via a communication line or the like.

A curvature may be used instead of the magnitude of the warp. Also in the case of using the curvature, the magnitude of the warp is uniquely obtained from the curvature and the diameter of the susceptor, which is equivalent to the use of the magnitude of the warp.

Next, an initial film formation condition is acquired and set (step S103). Specifically, the initial film formation condition corresponding to the magnitude of the warp of susceptor 7 is read from recording medium 41 storing database 6. If there is no data in database 6 that matches the warp magnitude of susceptor 7, for example, the initial film formation condition of the warp magnitude having the smallest difference from the warp magnitude of susceptor 7 may be read out. That is, in this embodiment, the initial film formation condition depends on the magnitude of the warp of susceptor 7. The initial film formation condition includes, for example, a condition related to the set temperature of each heater 30, that is, a condition related to the heater balance of heater unit 3. The initial film formation condition is an example of a first initial film formation condition.

Next, the initial film formation condition acquired in step S103 is stored in storage medium 42 as a film formation condition (step S104). Next, a plurality of wafers W are placed on susceptor 7, the film formation condition is read from storage medium 42, a semiconductor film is formed on the plurality of wafers W under the read film formation condition, and the plurality of wafers W with the semiconductor film formed thereon are taken out to the outside of film forming apparatus 1 (step S105). The semiconductor film formed in the step S105 may be a single film or a laminated film in which a plurality of films are laminated. For example, an SiC wafer may be used as wafer W, and a laminated film in which an AlN film, a GaN film, an AlGaN film, and a GaN film are laminated in this order on wafer W may be formed as the semiconductor film. Further, wafer W is placed such that, for example, a notch or orientation flat formed in wafer W is positioned on a straight line connecting the center of susceptor 7 and the center of wafer W. Wafer W is an example of a first wafer, and the semiconductor film is an example of a first film.

Figure 17:
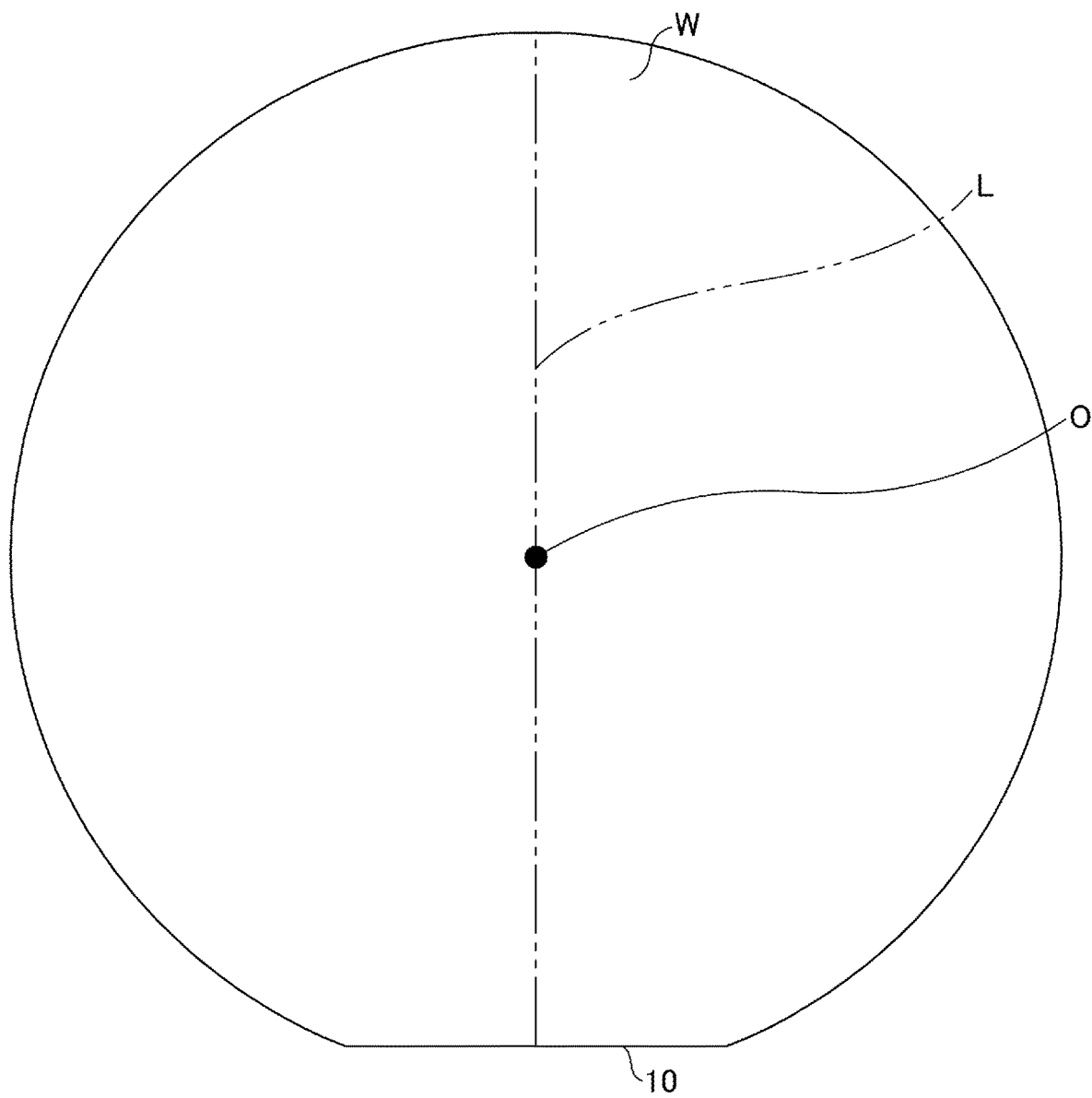
FIG. 17 is a diagram illustrating an example of a straight line in which points, at which film thicknesses are measured, are arranged.

Next, a film thickness of the semiconductor film is measured to obtain a film thickness distribution (step S106). The film thickness of the semiconductor film can be measured using, for example, a spectroscopic ellipsometer. The film thicknesses of the semiconductor film are measured, for example, at a plurality of points on the straight line connecting the center of susceptor 7 and the center of wafer W during the film formation. The film thicknesses of the semiconductor film are measured at a 2 mm interval when, for example, a diameter of wafer W is about 100 mm (4 inches). FIG. 17 is a diagram illustrating an example of the straight line in which points at which film thicknesses are measured are arranged. For example, as illustrated in FIG. 17, an orientation flat 10 is formed on wafer W, and the film thicknesses are measured at a plurality of points on a straight line L that passes through a center O of wafer W and that is orthogonal to orientation flat 10.

Next, it is determined whether or not the film thickness distribution in wafer W satisfies a predetermined film thickness distribution condition (step S107). For example, it is determined whether the film thickness is within a predetermined range.

When the thickness distribution does not satisfy the film thickness distribution condition, the film formation condition is changed according to the film thickness distribution, and information of the film formation condition stored in storage medium 42 is updated (step S108). Then, in step S105, the plurality of wafers W are replaced, the updated film formation condition is read from storage medium 42, and a semiconductor film is formed on the plurality of wafers W under the read film formation condition. Thereafter, the processing from step S105 to step S108 is repeated as a trial production until the film thickness distribution satisfies the film thickness distribution condition.

When the film thickness distribution satisfies the film thickness distribution condition, the previous film formation condition in the immediately preceding film formation is set as the mass-production film formation condition, and determined as a final film formation condition (step S109). Then, the plurality of wafers W are placed on the susceptor, the film formation condition is read from storage medium 42, the film formation is performed under the read film formation condition, and the plurality of wafers on which the film formation has been performed are taken out from the film formation chamber (step S110). As a mass-production process, film formations on a plurality of wafers are repeated a predetermined number of times (step S111). Wafer W used in the step S110 is an example of a second wafer.

By such a method, the mass-production film formation condition can be determined, and the film formations can be performed under the mass-production film formation condition. After the semiconductor film is formed in the mass-production process, a protective film, an interconnect, and the like are formed to complete the semiconductor device.

In this embodiment, the initial film formation condition depends on the magnitude of the warp of susceptor 7. Therefore, it is possible to reduce the repetition frequency of the processing from step S105 to step S108 until the film thickness distribution satisfies the film thickness distribution condition. That is, the number of trial productions can be reduced. In some cases, it may be possible to determine the mass-production film formation condition without repeating the processing from step S105 to step S108.

Therefore, the time from the replacement of susceptor 7 to the start of mass production can be shortened, and the productivity can be improved. In addition, it is also possible to reduce the amount of wafer W and raw material gas used for trial productions and to reduce the cost of such members.

In the present embodiment, the set temperature of each heater is adjusted as an example of the film formation condition. The film thickness distribution is particularly susceptible to temperature. According to the present embodiment, it is easy to determine a heater balance suitable for appropriate mass production. Further, since the plurality of heaters 30 are arranged concentrically, it is easy to control the temperature of the plurality of wafers W placed concentrically on susceptor 7.

When the semiconductor film of GaN, AlGaN, or the like is formed by the MOCVD method, the susceptor is likely to be consumed. However, according to the present embodiment, even if the susceptor is replaced, the mass-production film formation condition can be determined by a small number of trial productions.

Figure 18:
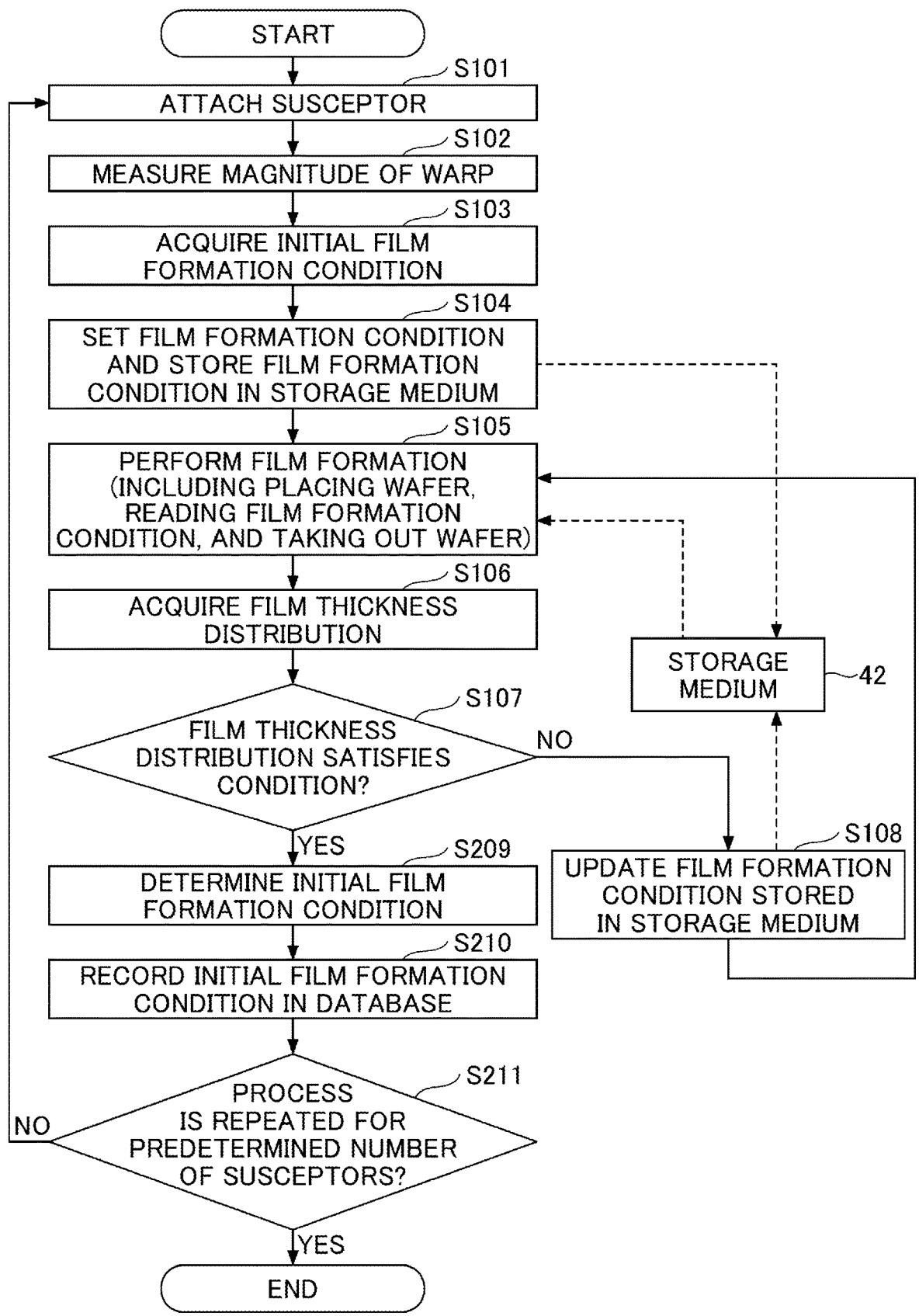
FIG. 18 is a flowchart illustrating a method of constructing a database.

Here, a method of constructing database 6 will be described. FIG. 18 is a flowchart indicating the method of constructing database 6.

First, in this method of constructing the database, susceptor 7 is attached to the film formation chamber (step S101). Next, the magnitude of the warp of susceptor 7 is measured (step S102). Next, an initial film formation condition is acquired (step S103). As in the reference example, the initial film formation condition may be a film formation condition that does not depend on the warp of susceptor 7.

Next, the initial film formation condition acquired in step S103 is stored in storage medium 42 as a film formation condition (step S104). Next, a plurality of wafers W are placed on susceptor 7, the film formation condition is read from storage medium 42, a semiconductor film is formed on the plurality of wafers W under the read film formation condition, and the plurality of wafers W with the semiconductor film formed thereon are taken out to the outside of film forming apparatus 1 (step S105). Next, the thickness of the semiconductor film is measured to obtain a film thickness distribution (step S106). Next, it is determined whether or not the film thickness distribution satisfies a predetermined film thickness distribution condition (step S107).

If the film thickness distribution does not satisfy the film thickness distribution condition, the film formation condition is changed according to the film thickness distribution, and the information of the film formation condition stored in storage medium 42 is updated (step S108). Then, in step S105, the plurality of wafers W are replaced, the updated film formation condition is read from storage medium 42, and a semiconductor film is formed on the plurality of wafers W under the read film formation condition. Thereafter, the processing from step S105 to step S108 is repeated until the film thickness distribution satisfies the film thickness distribution condition.

When the film thickness distribution satisfies the film thickness distribution condition, the film formation condition in the immediately preceding film formation is determined as an initial film formation condition corresponding to the magnitude of the warp acquired in the step S102 (step S209), and this initial film formation condition is recorded in database 6 (step S210).

In this way, one piece of data associating the magnitude of the warp of susceptor 7 with the initial film formation condition for forming the semiconductor film is added to database 6. By executing such processing for a predetermined number of susceptors 7, database 6 is constructed (step S211).

Figure 19:
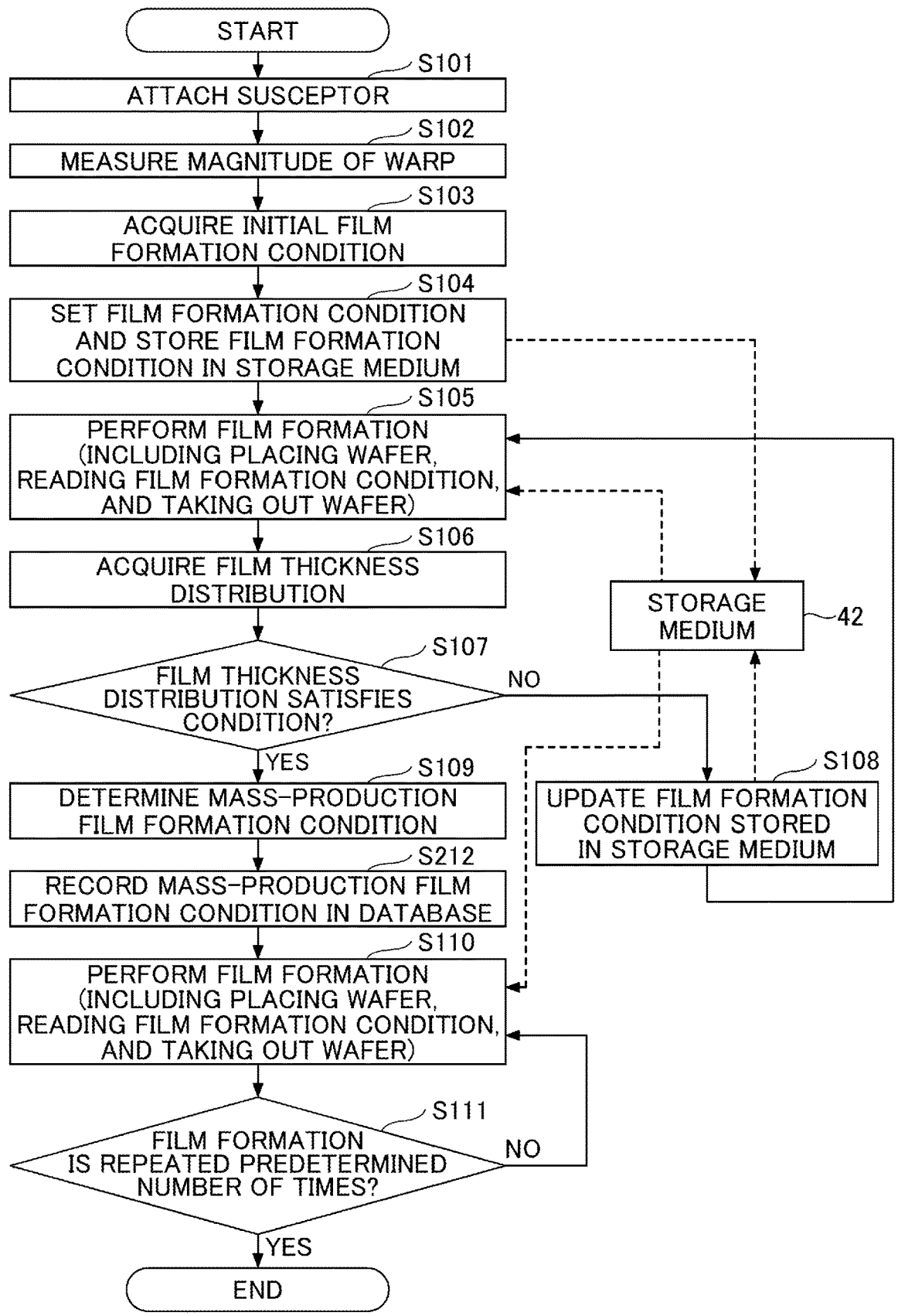
FIG. 19 is a flowchart illustrating a method of manufacturing a semiconductor device according to a modification of the embodiment.

As indicated in FIG. 19, in the manufacturing process indicated in FIG. 12, after the mass-production film formation condition is determined (step S109), it is preferable to additionally record data associating the magnitude of the warp of susceptor 7 with the mass-production film formation condition into recording medium 41 storing database 6 as the data associating the magnitude of the warp of susceptor 7 with the initial film formation condition (step S212). By increasing the data, it is possible to further reduce the frequency of processing from step S105 to step S108 when susceptor 7 is replaced thereafter.

The set temperatures of the heaters 30 may be adjusted independently for all of the plurality of heaters 30, or the plurality of heaters 30 may be divided into a plurality of groups, and the set temperatures may be adjusted in common within the group. For example, in a case where heater unit 3 includes ten heaters 30, heaters 30 may be divided into two groups of five heaters 30, and the set temperatures of the five heaters 30 belonging to each group may be common.

Although the embodiment has been described above in detail, the present invention is not limited to the specific embodiment, and various modifications and changes can be made within the scope described in the claims.

What is claimed is:

1. A method of manufacturing a semiconductor device, comprising:
   attaching a first susceptor to a film forming apparatus;
   measuring a magnitude of a warp of the first susceptor;
   setting a first initial film formation condition as a film formation condition of the film forming apparatus in accordance with the measured magnitude of the warp of the first susceptor; and
   placing a plurality of first wafers on the first susceptor and forming a first film on the plurality of first wafers under the film formation condition,
   wherein the setting of the first initial film formation condition includes reading the first initial film formation condition from a recording medium storing a database, and wherein the database includes a plurality of pieces of data in which magnitudes of warps of susceptors are associated with initial film formation conditions for forming the first film.

2. The method according to claim 1,
wherein the film forming apparatus includes a plurality of heaters configured to heat the first susceptor, and
wherein the film formation condition includes a set temperature of each of the plurality of heaters.

3. The method according to claim 2, wherein the plurality of heaters are disposed concentrically.

4. The method according to claim 1, wherein the forming of the first film includes causing epitaxial growth of a semiconductor film by metal organic chemical vapor deposition.

5. The method according to claim 1, comprising:
acquiring a first distribution of a thickness of the first film on the first wafers after the forming of the first film; and
determining the first initial film formation condition as a mass-production film formation condition when the acquired first distribution satisfies a predetermined film thickness distribution condition.

6. The method according to claim 5, comprising:
repeating steps when the first distribution does not satisfy the predetermined film thickness distribution condition, until the first distribution satisfies the predetermined film thickness distribution condition, the steps including
changing the film formation condition in accordance with the first distribution,
replacing the plurality of first wafers,
forming the first film on the plurality of replaced first wafers under the changed film formation condition, and
acquiring the first distribution of a thickness of the first film; and
determining a previous film formation condition as the mass-production film formation condition, the previous film formation condition being used when the first distribution satisfies the predetermined film thickness distribution condition.

7. The method according to claim 5, comprising placing a plurality of second wafers on the first susceptor and forming the first film on the plurality of second wafers under the mass-production film formation condition after the determining of the mass-production film formation condition.

8. The method according to claim 5, comprising additionally recording data, in which the magnitude of the warp of the first susceptor is associated with the mass-production film formation condition, in the recording medium storing the database after the determining of the first initial film formation condition as the mass-production film formation condition.

9. The method according to claim 1,
wherein the database is stored in an external recording medium connected to an outside of the film forming apparatus via a communication line, and
wherein the plurality of pieces of data are added to the database from the outside of the film forming apparatus via the communication line.

10. The method according to claim 9, wherein the first susceptor has a serial number, and the plurality of pieces of data are added to the database based on the serial number.

* * * * *